Dec. 2, 1969 R. O. GUNDERSON ET AL 3,482,111

HIGH SPEED LOGICAL CIRCUIT

Filed March 4, 1966 4 Sheets-Sheet 1

INVENTORS
ROBERT O. GUNDERSON
DONALD K. LAUFFER

BY Louis A. Kline
John T. Mathago
Richard T. Renzel
THEIR ATTORNEYS

HIGH SPEED LOGICAL CIRCUIT

Filed March 4, 1966 4 Sheets-Sheet 2

INVENTORS
ROBERT O. GUNDERSON
DONALD K. LAUFFER

BY

THEIR ATTORNEYS

HIGH SPEED LOGICAL CIRCUIT

Filed March 4, 1966 4 Sheets-Sheet 3

INVENTORS
ROBERT O. GUNDERSON
DONALD K. LAUFFER

BY [signature]

THEIR ATTORNEYS

INVENTORS
ROBERT O. GUNDERSON
DONALD K. LAUFFER

BY Louis A. Kline
John J. Maclago
Richard T. Lengel
THEIR ATTORNEYS

United States Patent Office 3,482,111

Patented Dec. 2, 1969

3,482,111
HIGH SPEED LOGICAL CIRCUIT

Robert O. Gunderson, Torrance, and Donald K. Lauffer, Gardena, Calif., assignors to The National Cash Register Company, Dayton, Ohio, a corporation of Maryland Filed Mar. 4, 1966, Ser. No. 531,938
Int. Cl. H03k 19/24, 19/36
U.S. Cl. 307—203 10 Claims

ABSTRACT OF THE DISCLOSURE

A monolithic integrated circuit providing a logical building block for logical systems comprising an input gate and regulated emitter follower stage of current amplification coupled to an output inverter circuit which provides for anti-saturation and load compensation by a digital feedback network.

The present invention is directed to high speed logical circuit arrangements and more particularly to improved elemental circuits which comprise basic building blocks in logical systems.

In general, the requirements of logical circuits are to provide decision-making operations, amplification, and storage in a logical system. The decision-making operations are accomplished by a number of logical gates formed by the aforesaid elemental circuits or building blocks. Further, substantially all of the complex functions of a logical system, including storage, are capable of being performed by interconnecting the basic building blocks according to logical design principles as defined by a series of logical equations for example.

The basic decision-making gates are an AND gate wherein all inputs must be "true" (binary "1" state) in order for the output to be "true"; and an OR gate wherein any input being true causes the output of the OR gate to be "true." NAND and NOR gates (AND-NOT or NOT-AND) correspond to AND and OR gates, respectively, with inversion or complementing at the output and input, respectively. Whenever NAND or NOR gates have only a single input which is inverted at the output and input, respectively, they are referred to as NOT gates. The function of amplificataion is performed by each basic building block and combinations of building blocks as double drivers, i.e., cascade coupling. Storage circuits, e.g., flip-flops and latches, are also formed by combinations of said basic building blocks.

In addition to providing the basic logical requirements in a logical system, the basic building block should provide additional features disclosed by the present inventors in a prior co-pending U.S. patent application, Ser. No. 505,477, filed Oct. 28, 1965, assigned to a common assignee. In said prior co-pending application, many additional features not disclosed by the prior art are provided, including stability of operation, noise immunity, and the advantages of the fully integrated circuit construction disclosed therein. Also, the importance of providing a single basic building block for one or more logical systems is discussed in said co-pending application, emphasizing the need for an elemental logical circuit which can be produced economically in mass production using fully integrated (monolithic) circuit techniques.

The present invention is directed to improvements in the logical circuit arrangement disclosed in the prior co-pending application. These improvements are directed primarily to providing substantially faster operation of the basic building block and, consequently, higher speed data processors and other logical systems. The present emphasis on higher speed operation of data processors is in recognition of the need for much larger data handling capacity of data processing systems for many large business establishments and data processing centers. In addition to the tremendous growth in volume of data to be processed, an urgent demand for higher speed and larger data handling capacity has followed the introduction of "on-line" time-sharing of data processing systems by many small business establishments.

In the higher speed data processing systems for business or commercial use, thin-film memories are being used which have a cycle time period of less than one (1) microsecond. Development and improvement of this type of memory have resulted in more than doubling this speed; i.e., thin-film memories having cycle times of less than 500 nanoseconds. In order to process data accessed from these faster memories within the shorter time period of a memory cycle, and thus not extend the operating cycle for processing of data, more reliable higher speed logical circuits are required for processors for these improved memories to provide higher speed data processing systems. While the time period of delay of an individual logical circuit may not appear significant, it should be realized that signals in a processor must be propagated through many logical circuits to perform certain logical operations in which the individual delay time periods are cumulative. Thus, in a typical processor having cumulative delays of thirty-two elemental logical circuits, for example, the total delay should not be greater than the memory cycle time period. In the logical circuit arrangement of the aforementioned prior application, the cumulative delay time periods of the logical circuits in the processor have been found to be larger than desirable for processing data accessed from the improved memories in a data processing system.

The inherent limitation of all logical circuits which operate in saturation is the storage time delay, which is the time period required to bring the output transistors of the logical circuits out of saturation (turn-off time). There are many advantages in this mode of operation of logical circuits, one of the most important being the low output impedance of the output transistor operating in saturation and the noise immunity thus provided. The present invention overcomes the inherent limitation of logical circuits having this mode of operation as disclosed, for example, in the aforesaid co-pending application, by the provision of novel circuit arrangements in which the operation of the output transistors and other transistors affecting the speed of logical circuits is maintained outside the region of saturation while assuring reliability under all conditions of operation. Accordingly, the present invention is directed not merely to logical circuits in which the output transistor, for example, is maintained out of saturation (unsaturated mode of operation to provide faster response), but to novel circuit arrangements of logical circuits which have adequate stability and noise immunity to be reliable in data processing systems manufactured for business use. Further, in order for manufacturing costs to be practical, requisite electrical characteristics of these logical circuits should be realizable with high production yields of circuits (which is often not the case in systems intended for use by military and space systems). Thus, certain variations in electrical characteristics within reasonable tolerances of components must be provided for by improvements in the individual logical circuits or basic building blocks to maintain reliability of operation of data processing systems to avoid dependence upon close tolerances of components for reliability. As is known, the cost of components or circuits meeting close electrical tolerances is prohibitive in the successful production and sale of these systems. In view thereof, a practical and useful logical circuit for data processing systems intended for commercial sale and business use must provide the additional operational stability and noise immunity required within the wider tolerances of components and logical circuits available at a reasonable cost.

In view of the foregoing, it should be evident that integrated circuit construction of logical circuits of the present invention is preferred to provide the requisite high speed operation, and in the detailed disclosure which follows, the logical circuits of the present invention are constructed in accordance with integrated circuit design principles. In addition, certain novel integrated circuit arrangements are disclosed which provide even higher speed operation and other improvements in operation not found in or contemplated by prior integrated circuit arrangements. Further, as discussed in the aforementioned co-pending application, it is extremely important to provide a single circuit arrangement which is capable of producing a basic circuit operation common to gates, flip-flops, and other logical circuits of one or more logical systems employing integrated circuit construction. This single circuit arrangement is shown and disclosed, infra, by alternate preferred embodiments, either one of which can be used as basic building blocks for one or more logical systems. Accordingly, it is an object of the present invention to provide logical circuits having the foregoing advantages and features of high speed, while retaining operational stability and noise immunity in a logical system in order to process data in the shorter cycle time of a system which includes improved higher speed memories.

Another object of the present invention is to provide basic logical building blocks providing higher speed operation and operational stability.

A further object of the present invention is the provision of high speed logical circuit arrangements comprising basic logical building blocks in which binary input signals coupled thereto are referenced to predetermined uniform high and low signal levels in the input circuits.

Still another object of the present invention is to provide improved logical circuit arrangements which have a minimum of time delay and regulated output voltages.

Another object of the present invention is to provide a fully integrated logical circuit which operates at substantially higher speed and compensates for variations in operating characteristics of individual circuits, including circuits formed from different wafers under different environmental conditions within any logical system construction.

A further object of the present invention is the provision of an improved logical circuit arrangement capable of operating reliably in the unsaturated or slightly saturated mode under all expected conditions in a data processing system to produce a minimum of storage time delay during switching.

Another object of the present invention is to provide monolithic integrated circuits capable of being produced by a batch process having a high yield of such circuits which operate reliably in logical systems.

Still another object of the present invention is to provide a logical circuit arrangement having the foregoing features and advantages and operative from a single voltage source in a logical system.

A further object of the present invention is to provide a logical circuit having an improved output circuit which provides a regulated output voltage.

Another object is to provide high speed logical circuits having outputs capable of being directly interconnected to produce certain logical functions in systems.

Other objects and features of the invention will become apparent to those skilled in the art as the disclosure of the present invention is made in the following detailed description of a preferred embodiment of the invention illustrated in the accompanying sheets of drawings in which.

Figures 1, 2, 3:
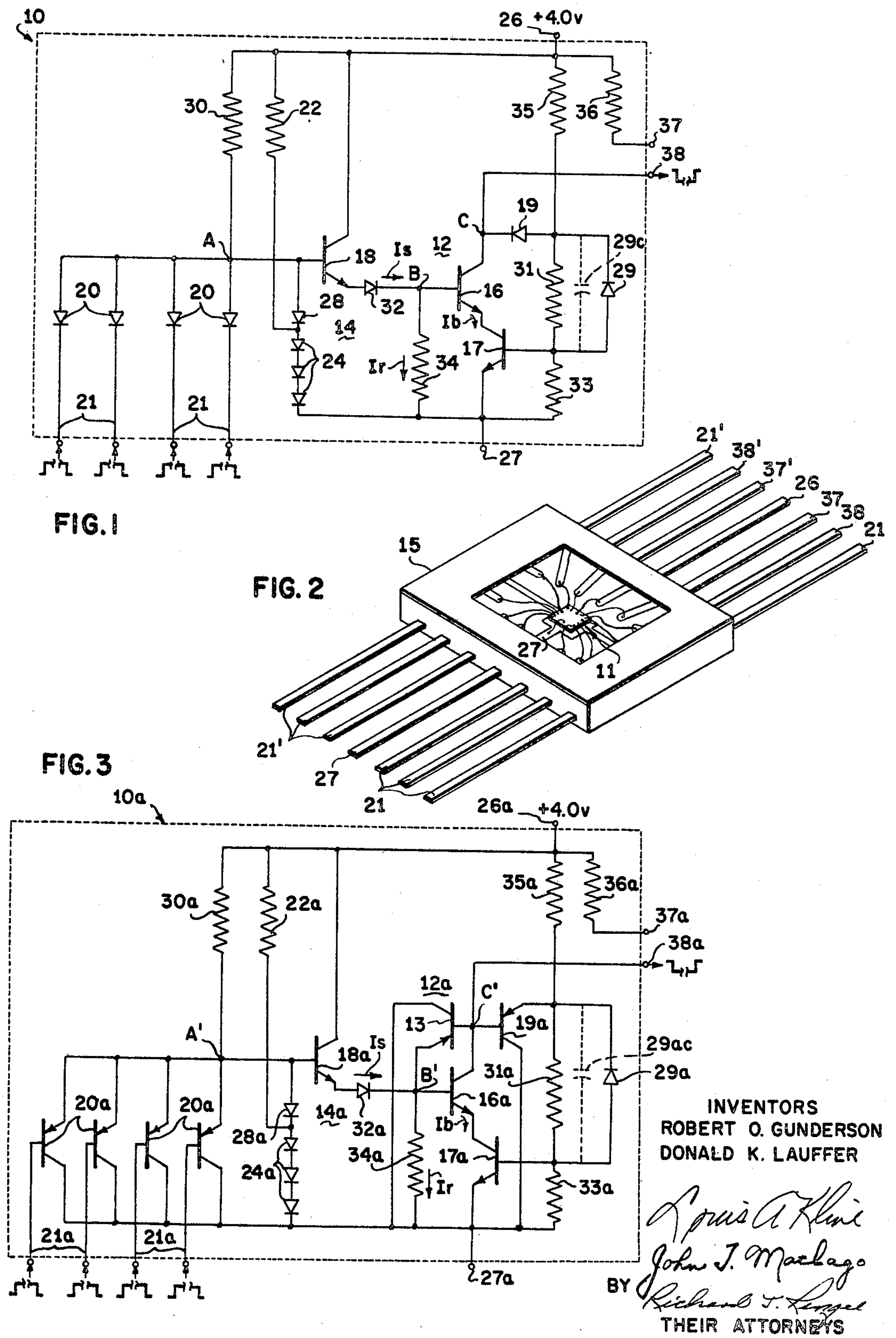
FIG. 1 is an electrical circuit diagram of a preferred embodiment of the logical circuit arrangement of the present invention.
FIG. 2 is a greatly enlarged pictorial view of a typical fully monolithic integrated circuit package enclosure for the logical circuit arrangements of the present invention shown in FIG. 1 or 3.
FIG. 3 is an electrical circuit diagram of an alternate preferred embodiment of the logical circuit arrangement of the present invention.
Figure 7A:
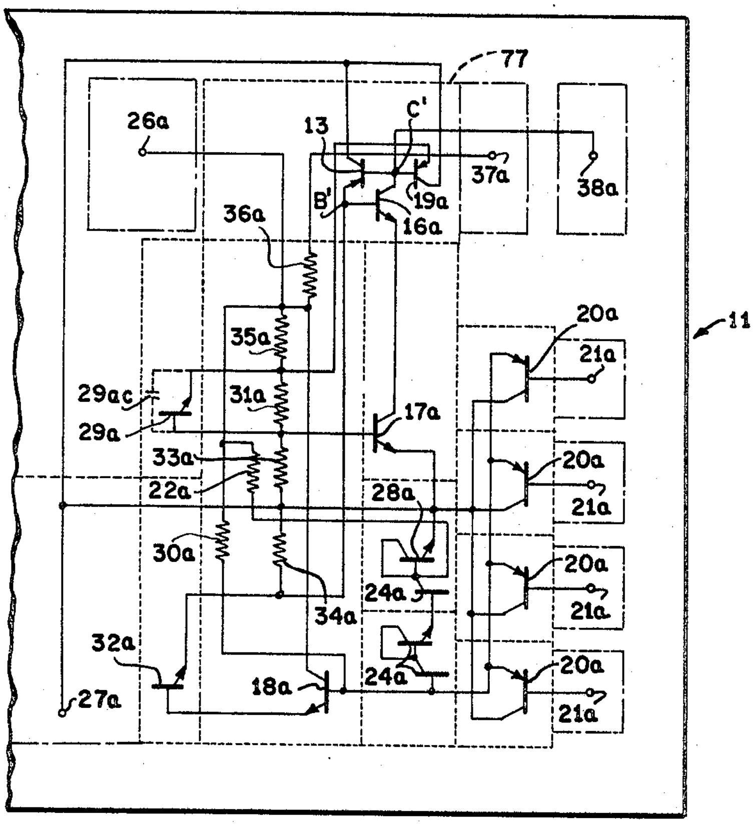
Figures 7B, 7C, 7D:
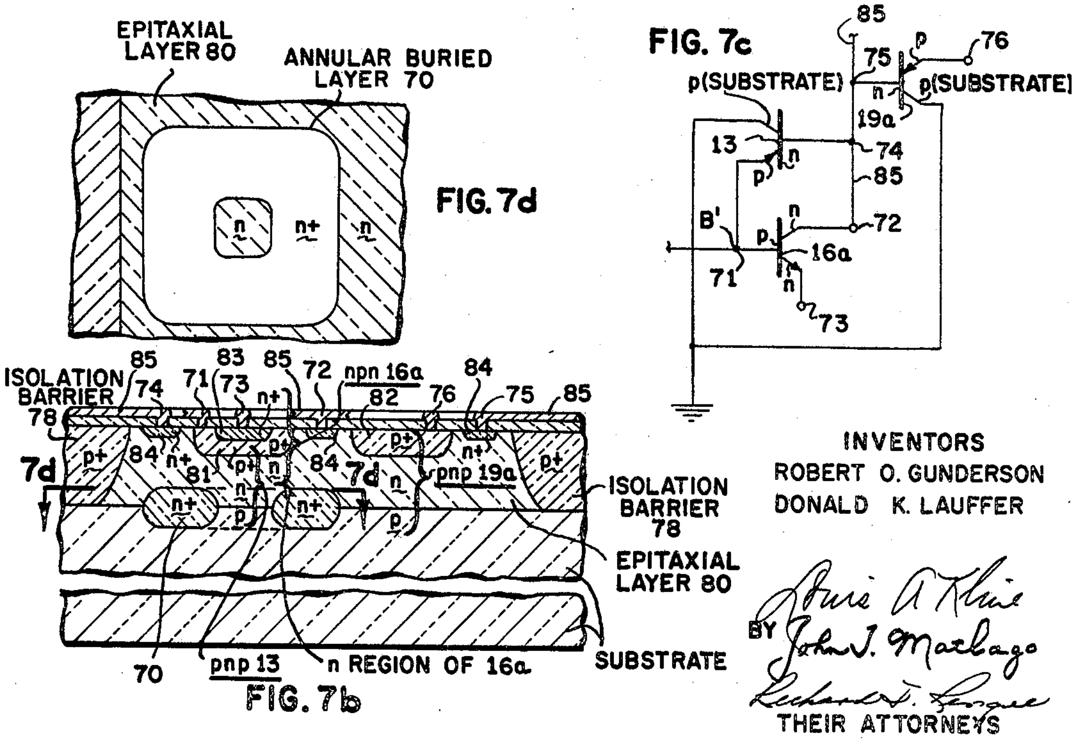
Figure 8:
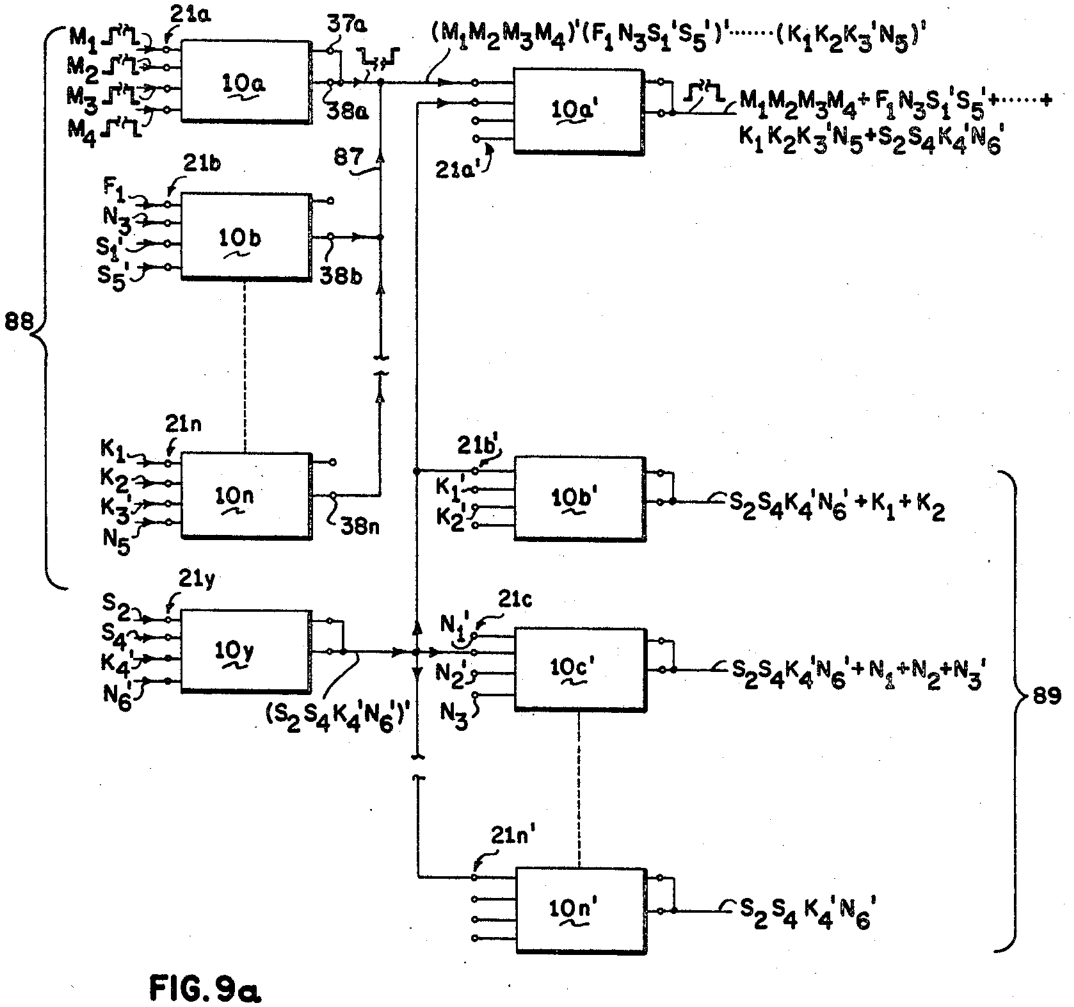
Figure 9A:
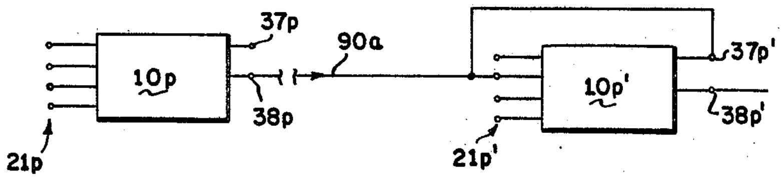
Figure 9B:
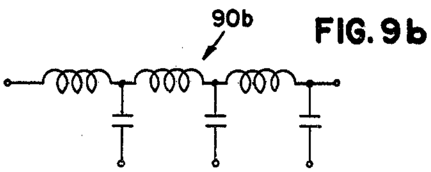

FIG. 7*a* is a greatly enlarged diagrammatic illustration of the present invention including a plan view of a portion of an integrated circuit "chip" of the alternate logical circuit of FIG. 3 disposed in an enclosure as shown in FIG. 2, including the isolation areas of the "chip" and a modified electrical circuit diagram of the components and connections of a complete logical circuit of the present invention of FIG. 3 superimposed on this portion of the "chip";

FIG. 7*b* is a greatly enlarged vertical cross-section of a particular isolation area of the integrated circuit "chip," shown in FIG. 7*a*, for illustrating certain novel features in the construction of the present invention;

FIG. 7*c* is an electrical circuit diagram of the integrated circuit construction shown in FIG. 7*b*;

FIG. 7*d* is a horizontal cross-section of a particular isolation area of the integrated circuit "chip," shown in FIG. 7*a*, for showing the annular "buried" layer in the construction of the present invention to provide the circuit arrangement of FIG. 7*c*;

FIG. 8 is a block diagram showing a typical logical system arrangement for illustrating novel features of the present invention in a logical system;

FIG. 9*a* is another block diagram of a typical portion of a logical system arrangement for illustrating certain novel features of the present invention; and FIG. 9*b* is an electrical circuit diagram of a transmission line which illustrates the characteristics of typical lines interconnecting the logical circuit arrangements of the present invention in a logical system.

Referring now to the drawings, the logical circuit arrangements of the present invention which provide high-speed operation are shown in FIGS. 1 and 3. The embodiment shown in FIG. 1 comprises a diode-transistor logical (DTL) circuit 10 which includes an output circuit 12 preceded by an emitter-follower circuit 14 having its input connected to diodes 20 of a diode gate. The embodiment shown in FIG. 3 comprises a transistor-transistor logical (TTL) circuit **10*a* which includes an output stage 12*a* preceded by an emitter-follower circuit 14*a* having its input connected to pnp transistors 20*a* of a transistor gate. The output circuits 12 and 12*a* include switching transistors 16 and 16*a*, respectively, which are operative in either their "cut-off" region or "active" region to provide two distinct binary logical voltage level outputs (high and low) at their collectors in response to high and low signals applied to their bases from the emitter-follower circuits 14 and 14*a*, respectively. Operation of transistors 16 and 16*a* on the edge of saturation or barely in saturation is expected. However, this operation will not extend the propagation time during switching because the storage time delay is negligible. In FIG. 2, a typical fully (monolithic) integrated circuit package 15 is shown for either of logical circuits of FIG. 1 or 3. This package provides a protective enclosure, seat and electrical connections to the single block or "chip" 11 of silicon mounted therein wherein each block comprises a pair of identical logical circuits 10 or 10*a***. A detailed description of the fully integrated circuit shown in FIG. 3 is set forth, infra.

Referring again to FIG. 1 for a detailed description thereof, the circuit arrangement of the emitter-follower 14 comprises a transistor 18 havng its base coupled to the diodes 20 of the input gate with means for referencing binary signal voltages applied to the input terminals 21 by a voltage reference circuit including a resistor 22 and voltage reference diodes (string) 24. This voltage reference circuit is connected between a voltage supply source terminal 26 and ground terminal 27 to maintain a "bleeder" current therethrough during all conditions of circuit operation. One of the function of this reference circuit is to provide a precise, clamping voltage reference to the base of transistor 18 of the emitter-follower circuit 14 whereby the high binary voltage levels (+4.0 v.) of the signals applied to the input terminals 21 are precisely controlled to a desired high voltage level (+2.8 v.) at the input node A via clamping diode 28 to maintain the transistor 18 in the desired "active" region of operation. (It should be noted that transistor 18 is not necessarily "turned-off," but conducts only a small current (e.g., 1 ma.) when low level signals are applied to the inputs 21.)

Figure 4:
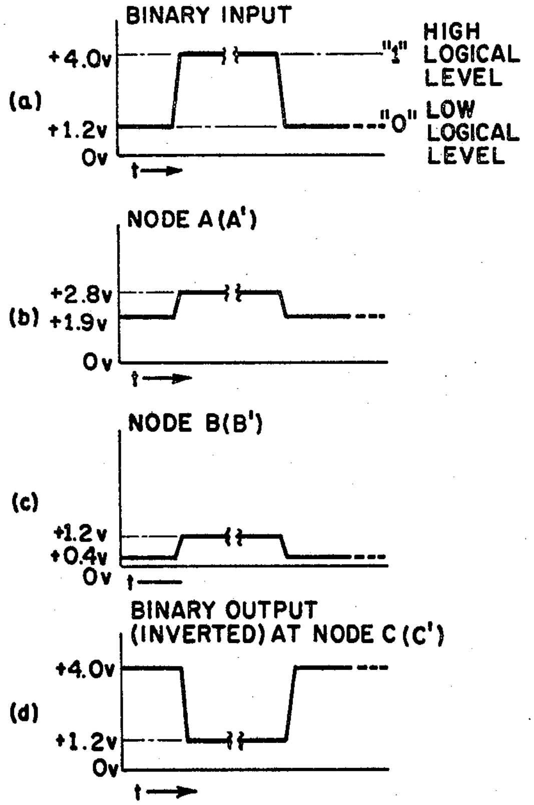
FIGS. 4 and 5 are diagrams of typical waveforms for illustrating the operation of the logical circuit arrangements of FIG. 1 or FIG. 3 in "true" and "false" states, respectively.

In FIG. 1, each of the gate diodes 20 is shown connected to conduct current away from input node A. Diodes 20 are coupled to the input (base) of the transistor 18 of the emitter-follower circuit which input is also connected to the voltage supply source terminal 26 through a current limiting resistor 30 and to the reference voltage through the clamping diode 28 which limits the high voltage (e.g., +2.8 v., as shown in FIGS. 4(*b*) and 5(*b*)) at the base of transistor 18 to the reference voltage level (e.g., +2.1 v.) plus the forward voltage drop of the clamping diode (e.g., +0.7 v.). The high logical voltage level (e.g., +4.0 v., as shown in FIG. 4(*a*)) is at the same level as the supply voltage. Since the high voltage level at the input of the emitter-follower circuit 14 (node A) is regulated to be substantially lower than the high logical voltage level applied to the gate input terminals 21, a "back-bias" (e.g., 1.2 v.) is applied to the diodes 20. Accordingly, in addition to other circuit features, the logical circuit arrangement of the present invention is substantially immune to noise, e.g., inductively or capacitively coupled to lines interconnecting the outputs and inputs of the logical circuits of any logical system, thus making the logical circuit free from false triggering when all logical signals applied to terminals 21 are at the high logical level.

Additional advantages of providing noise immunity at the high logical level will be made evident from the later detailed description of the present invention in conjunction with the diagram in FIG. 6 and also the logical system arrangement of FIG. 8 wherein it will be made evident that noise immunity of the present circuit arrangement for high logical levels (at input terminals 21) will result in the desired noise immunity in logical systems in part because of the interconnection of outputs and inputs in cascading of logical circuits in the stages of logical systems for multi-level logic (e.g., a series of stages of NAND circuits).

Another important advantage of the circuit arrangement shown in FIG. 1 results from the foregoing feature in that the present logical circuit arrangement is capable of operating at a higher voltage for the high logical level, i.e., at the supply voltage level which provides for maximum separation of the binary logical levels for a given supply voltage, minimum power requirements, maximum speed, and specified maximum tolerances of circuits and circuit components. Further, noise immunity at low logical voltage levels is provided by including a substantial bias across the base-emitter junction of the switching transistor 16.

The proper bias across the base-emitter junction of the transistor 18 is provided for by resistor 34 and a diode 32. Since the input terminals 21 are assumed to be coupled to outputs of other logical circuits 10 and driven thereby, the voltage level at node B provides for operation of the transistor 18 in the active state when all inputs of the terminals 21 are at the high logical level. Diode 32 establishes this voltage level at node B (in conjunction with the reference voltage at node A and the voltage drop across the base-emitter junction of transistor 18) when diode 32 is forward biased into conduction. Diode 32 also provides a voltage margin for "turn-on" threshold noise rejection for the transistor 16 when the present logical circuit arrangement 10 is in the "false" state (at least one input signal applied to input terminals is at the low logical level, e.g., +1.2 v.).

In this input circuit arrangement, resistor 30 determines the "fan-in" loading current, which is supplied to each of the logical circuits having their outputs coupled to respective ones of the input terminals 21 which must absorb, i.e., "sink," this current to prevent node A from rising and turning-on transistors 18 and 16. Also, resistor 30 must supply the current to maintain transistors 18 and 16 "turned-on" under all expected (noise) conditions during operation of the logical circuit 10 in its "true" state. The resistor 34 connects the node B to the low potential of the logical circuit (ground) to maintain a voltage drop across the diode 32 and the base-emitter junction of transistor 18 whereby voltage at node B is maintained below its "turn-on" threshold level (and providing a noise margin, e.g., 0.4 v.) while any low level input signal is being applied to the diode input gate. It also should be noted that the resistor 34 affects the switching time of the logical circuit since the transistor-base "turn-off" current is limited by the total resistance of resistor 34. Thus, while it is desirable to provide a higher value resistor 34 to produce faster "turn-on" of transistor 16 and eliminate unnecessary current drain during active state operation of transistor 16, the value of resistor 34 must be selected to provide adequate "turn-off" current to meet the over-all high speed requirements for the logical circuit 10.

Further, noise immunity is provided in a series connected pair of logical circuit arrangements because of the regulation of the output voltage at output node C. The provision of a regulated high logical level voltage (e.g., 4.0 v.) at the output eliminates noise produced by individual logical circuits in the system whereby the noise level is substantially reduced in the system. As a result, the separation of high and low logical levels can be reduced to improve the response to the individual logical circuits and to increase the speed of the system. Accordingly, the logical circuits of the present invention provide higher speed operation by improved circuit arrangements for regulation of the output (high logical voltage level) for reducing the voltage swing between logical voltage levels and thereby reducing the switching time, i.e., delaying effect due to output loading capacitance, as well as providing for operation (substantially) in the unsaturated mode. Further, as set forth later in the description of the logical circuit of FIG. 3, improved operation in the unsaturated mode is provided by improvements in anti-saturation integrated circuitry for the output circuit 12. Accordingly, substantial advantages are provided by the input circuit of the logical circuit arrangement of FIG. 1 and logical systems where it is employed as a building block.

The output circuit 12 of the logical circuit arrangement shown in FIG. 1 provides some of the more important features in deriving high speed operation with an adequate degree of noise immunity to operate satisfactorily under all conditions expected in logical systems designed and produced for commercial use. Considering the details of this output circuit as shown in FIG. 1, the collector of the transistor 16 is connected to the output terminal 38 to supply the logical signals to other circuitry of a system of which the present logical circuit is intended to be a basic building block as shown in FIG. 8, for example. As shown, the output terminal 38 is connected to the supply source terminal 26 via terminal 37 and collector resistor 36 (FIG. 1). The output terminals 37 and 38 are provided to facilitate paralleling outputs of multiple logical circuits 10 to provide an AND function among the interconnected outputs (e.g., as shown by interconnection of the ouputs 38, 38*a* . . . 38*n* of logical circuits of group 88 shown in FIG. 8). The load resistor 36, connected to terminal 37, provides leakage current for input gate diodes of other logical circuits, e.g., logical circuit 10*a'* (FIG. 8) which are coupled to the output terminal 38, and also noise protection resulting from the inherent R-C time constant. Load resistor 36 should be of a large value to minimize possible collector current (while providing a high level output (4.0 v.) in the false state) consistent with high speed switching time requirements since the total resistance of resistor 36 must be taken into account such that the output circuit is capable of supplying the necessary changing current for the output loading capacitance (stray capacitance of interconnecting lines, inherent capacitance of gate diodes, etc.).

The portions of the output circuit which are about to be considered provide voltage regulation of the output at the low logical level and decrease the switching time intervals, including both "turn-on" and "turn-off" time intervals. In order to provide some indication of the speed of operation achieved by the present logical circuit in operation, it has consistently provided propagation of change in logical levels applied to the gate inputs in the range of 3 to 4 nanoseconds, which is the delay of 3 to 4 feet of conductor.

Figure 5:
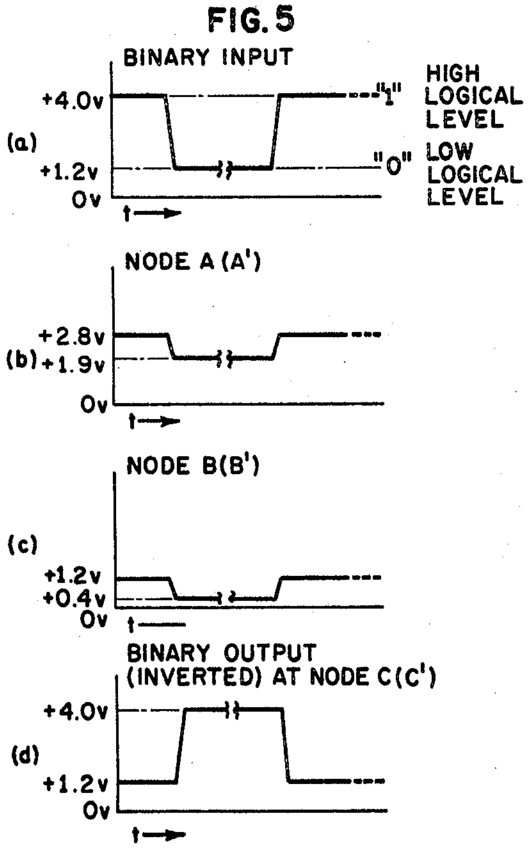

The operation of the logical circuit arrangement is now considered, and for the purposes of explanation, it will be assumed that the logical system in which the present circuit is contemplated being used, employs "positive" logic in which only two (logical) voltage level signals are considered, namely: the high logical voltage level signals which designate a binary "1" and the low logical voltage level signals which designate a binary "0" as illustrated by the waveforms in FIGS. 4(*a*) and 5(*a*). Accordingly, the circuit arrangement of FIG. 1 performs an AND-INVERT function (NAND gate) wherein each one of the binary signals of a high logical voltage level signal (e.g., +4.0 v.) is applied to a respective one of the input terminals 21 for diodes 20 of the diode gate circuit, as shown by typical signals in FIG. 1, to produce a regulated low logical voltage level signal (e.g., +1.2 v., as shown in FIG. 5(*a*)) at the output node C (collector of transistor 16). At this time, it should be noted that every one of the binary signals applied to the input terminals 21 must be at the high logical voltage level (e.g., +4.0 v.) to produce a low (inverted) voltage level signal (e.g., +1.2 v.) at the output terminal 38 as indicated by typical signals in FIG. 1, and whenever one or more of the binary signals applied to these input diodes 20 via input terminals 21 are at the low logical voltage level (+1.2 v.), the output will be at a high logical level (+4.0 v.) as shown by waveform in FIG. 5(*d*).

In response to the high logical level signals at each of the input terminals 21 (FIG. 1), the voltage at input node A is raised to a level (e.g., 2.8 v., as shown in FIG. 4(*b*)) to produce a "forward-bias" across the base-emitter junction of transistor 18, which places the transistor 18 in its active region ("turns on" transistor 18). When placed in this "on" state, a substantially constant current I*s* (e.g., 5.5 milliamperes) is caused to flow through a series diode 32 of a base voltage-divider circuit including also a bias resistor 34 to cause switching transistor 16 to be placed in its active state by a substantially constant base current I*b* (e.g., 4.6 milliamperes) produced therein by a "forward-bias" produced across the base-emitter junction of transistor 16 by a constant voltage-drop (e.g., 1.1 v.) across bias resistor 34.

During transition from the "off" state to the "on" state of transistor 16, the "turn-on" of transistor 16 is very fast, as is evident from the low impedance of the base current path when transistors 16 and 18 are "turned-on" as shown in FIG. 1. This current path includes the initial low impedance of transistor 17 (operating in "deep saturation") in the emitter circuit of transistor 16, low impedance of transistor 18 in its "on" active state, and a direct connection of the collector of transistor 18 to the supply source terminal 26. This low impedance path for base-emitter current for "turn-on" of transistor 16 provides a very fast build-up of base current for the fast response of logical circuit 10 to the change from the low logical level (1.2 v.) to the high logical level (4.0 v.) at the input to provide fast propagation times of logical signals therethrough. This is one of the important factors involved in decreasing the propagation delay of the logical level in the extremely short time period of three and one-half nanoseconds, for example.

Having considered the initial condition of the logical circuit 10 during "turn-on," it should be noted that the transistor 17 is operating "deep" in saturation because of the large base current supplied via the voltage divider (resistors 31, 33, and 35) at the junction between resistors 31 and 33. The voltage at this junction is well above the threshold voltage of transistor 17 when transistor 16 is "turned-off," which maintains transistor 17 operating in "deep saturation" so that there is provided a very low impedance path for "turn-on" of transistor 16. However, as soon as the threshold voltage of transistor 16 is reached (when transistor 18 is "turned-on" by the high logical level signals applied thereto at the input terminals 21, as shown in FIG. 1), the voltage at this junction is reduced to control the operation of transistor 17 in its active region to keep the collector of transistor 16 at a constant low logical level (1.2 v.). Excessive "overshoot" at initial "turn-on" of transistor 16 (output voltage at node C going further below the low logical level than shown on the transfer curve of FIG. 6) is avoided by the provision of back-biased diode 29, coupled across the resistor 31 to provide an A.C. bypass due to its parasitic capacity 29*c* as shown in FIG. 1. During the time interval transistor 16 is being "turned-on," the current from the supply source (terminal 26) is diverted from its path through resistors 31 and 33 through diode 19. Thus, the current previously flowing through resistors 31 and 33 of the voltage divider is reduced at the same time, but the R-C time constant or delay in reducing the base current supplied to transistor 17 via resistor 31 is too long in time to provide the necessary increase in impedance of transistor 17 to control the base current of transistor 17 in time to prevent excessive "overshoot" of output voltage below the desired level as shown in FIG. 6. Accordingly, the resistor 31 is bypassed by diode 29 (back-biased) having an inherent capacitance 29*c* which provides A.C. coupling of the output voltage at node C to the base of the transistor 17 to rapidly decrease its base current and increase its impedance to prevent excessive "overshoot" of the output past the low logical level.

The next condition of operation of the logical circuit 10 is the regulation of the output voltage at the low logical level (1.2 v.) while this circuit is in the "true" state, i.e., the time interval in which transistor 16 is finally past the transient stage of "turn-on" and the output voltage at node C has reached the low logical level as shown by the waveform of FIG. 4(*d*). In this condition of operation, the resistors 31 and 33 and the transistor 17 form a voltage regulator circuit to maintain the node C and output at a constant low logical level (1.2 v.). The regulation of the voltage at this level is provided by controlling the voltage across resistor 31 by means of transistor 17 in which the base-emitter voltage is closely regulated by the voltage applied to the base of transistor 17. Any rise in voltage above the low logical level (1.2 v.) at the output node C is coupled to the base of transistor 17 to increase the base current thereof which, in turn, lowers its impedance and, of course, the impedance of the emitter circuit of transistor 16. Lowering the impedance of transistor 17, therefore, causes more base current to flow in transistor 16 which, in turn, lowers its collector voltage (node C). The reverse of the aforedescribed regulator operation occurs whenever the output voltage at node C tends to go lower than the lower logical level (1.2 v.), i.e., any voltage at node C below the lower logical level is applied to the base of transistor 17 to decrease its base current and increase its impedance causing less base current to flow in transistor 16 to raise its collector voltage and the voltage at node C to the lower logical level (1.2 v.).

When transistor 16 is operated in its active region, the current through resistor 35 and diode 19 produces a voltage-drop across this resistor and diode which is substantially equal to the supply voltage (+4.0 v.) less the total forward voltage-drop across both junctions of each of transistors 16 and 17 (e.g., 1.2 v.) while operating in active states. This establishes the low logical voltage level at the output (node C) to the voltage drop (e.g., 1.2 v.) across transistors 16 and 17 operating in their active regions.

In the preceding description of the operation, it was specified that a substantially constant base current I*b* was produced for operating transistor 16 in its active state. Accordingly, the operation of the transistor 16 is further accurately controlled so as not to be driven (substantially) into the saturation region. Controlling the operation of transistor 16 in this precise manner (without a precisely regulated, i.e., inexpensive source of supply voltage or additional reference voltage sources, except for the circuit's own voltage reference circuit and by the transistor 17) is considered to be extremely advantageous in that the circuit is capable of switching to the opposite state (turn-off) in less time (fast response time) than circuits not providing this precise control of operation. The reason is that the transistor 16 does not store an excessive charge Q which induces a storage delay when being "turned-off" in response to a decrease in current I*s* (when transistor 18 is "turned-off" in response to a low logical level signal (+1.2 v.) at any one of the diode input terminals 21).

Having considered the beneficial effects of the provision of a substantially constant base current I*b* for transistor 16, the manner in which it is provided will now be described. It was noted above that the substantially constant base current I*b* was provided without corresponding precise regulation of the voltage supplied by the voltage supply source at terminal 26 (or other additional reference supply sources except for the circuit's own voltage reference circuit). For example, in the present logical circuit a (+7% to −7%) voltage variation does not affect the operation thereof and the reduction in cost of voltage supply in a logical system is substantial. In an earlier discussion of the voltage reference circuit (including resistor 22 and diodes 24 and 28) it was noted that the voltage at input node A was maintained at a predetermined high clamped voltage level (when all inputs at diode input terminals 21 are high) by the connection of the clamping diode 28 to a point between resistor 22 and the first of the diodes 24 in the "bleeder" current portion of the reference circuit. Accordingly, the voltage (e.g., +2.8 v., FIG. 4(*b*)) at node A, which causes transistor 18 to conduct, establishes a predetermined, substantial constant current I*s* and base current I*b* to the transistor 16 and divider current I*r* (e.g., 0.9 milliamperes) through the bias resistor 34. Because of the absence of a need for precise regulation of the supply voltage, expected variations in the supply voltage applied to terminal 26 will not affect the substantially constant base current I*b* during the time period that transistors 16 and 17 are "turned-on."

The foregoing discussion was directed to the circuit stability of logical circuit arrangement of the present invention because of the control of the voltages applied thereto by the volage referencing circuit. The following discussion is directed to the stability of this logical circuit in the presence of large temperature variations in the range of 15° C. to 55° C. (centigrade), for example, which are, in many instances, encountered in the operation of a logical system. In operation, the circuit arrangemetn of the present invention has been found to provide circuit stability to even larger temperature ranges. With reference to FIG. 1, it should be noted that the total current I*s* passes through the base-emitter junction of transistor 18 and diode 32, and this current I*s* divides through base-emitter junction of transistor 16 (I*b*) and bias resistor 34 (I*r*). At the same time, current also is passed through a parallel path through diodes 24 and 28 of the reference circuit. The voltage drop across diodes 24 and 28 establishes the reference voltage between node A and ground 27 which is the parallel path for voltage stability.

In the output logical circuit 10 of FIG. 1, it was noted earlier that when transistor 16 is "turned-off," transistor 17 and the voltage divider resistors 31 and 33 form a voltage regulator circuit to keep the collector of transistor 17 (and the output node C) at a constant voltage (1.2 v.). The circuit arrangement provides for a voltage across resistor 31 which is set by the base-emitter voltage (V*be*) of transistor 17. The base current in transistor 17 is small compared to the current through resistor 31, and therefore, substantially the same current flows in resistors 31 and 33. Accordingly, whenever the voltage at output node C rises (or attempts to rise) above 1.2 v., the voltage across resistor 33 rises, which increases the voltage V*be* of transistor 17 to increase the base current thereof to lower its impedance. This, as noted earlier, increases the base current I*b* of transistor 16 to restore (decrease) the voltage at its collector and output node C. The opposite voltage regulating operation occurs in response to a lowering of voltage at node C. Further, it should be noted that the output voltage or regulation thereof does not depend upon the absolute resistance values of resistors 31, 33, and 35, but only the ratio of these resistors which is important in monolithic integrated circuits where precise control of resistor values is extremely difficult. Thus, it should be clear for this additional reason that the construction of logical circuit 10 in this respect is particularly suited for monolithic integrated circuits.

In addition to providing improved stability, the logical circuit of the present invention reduces the time delay variation with temperature variation of each of these circuits employed in a logical system. In prior art circuits, for example, a typical variation in output current of 50 milliamperes was produced over the range of temperatures from 15° C. to 55° C. This change in output current causes a variation of over 3 nanoseconds in the storage delay alone without considering the variation in base delay (time required for movement of the depletion layer at the transistor junctions). This 3 nanosecond variation in time delay of individual circuits, having a total time delay of 15 nanoseconds, for example, comprises a considerable variation in total time delay. Since as many of 21 of these circuits are connected in successive stages of an adder, substantial advantages are obtained in logical systems in which a minimum of time delay variations are present in the individual logical circuit arrangements of the present invention.

Considering briefly the operation of the emitter-follower stage 14 which was described earlier, it should be noted that this emitter-follower stage has advantageously been employed in the present logical circuit which stage has no "Miller Effect" delay associated therewith and since the emitter-follower is operated in its active region and does not saturate, it thereby avoids storage delay associated with operation in its region of "saturation." This feature contributes in part to the high speed operation of the present logical circuit arrangement and any logical system using a great number of these logical circuits in the system arrangements.

Figure 6:
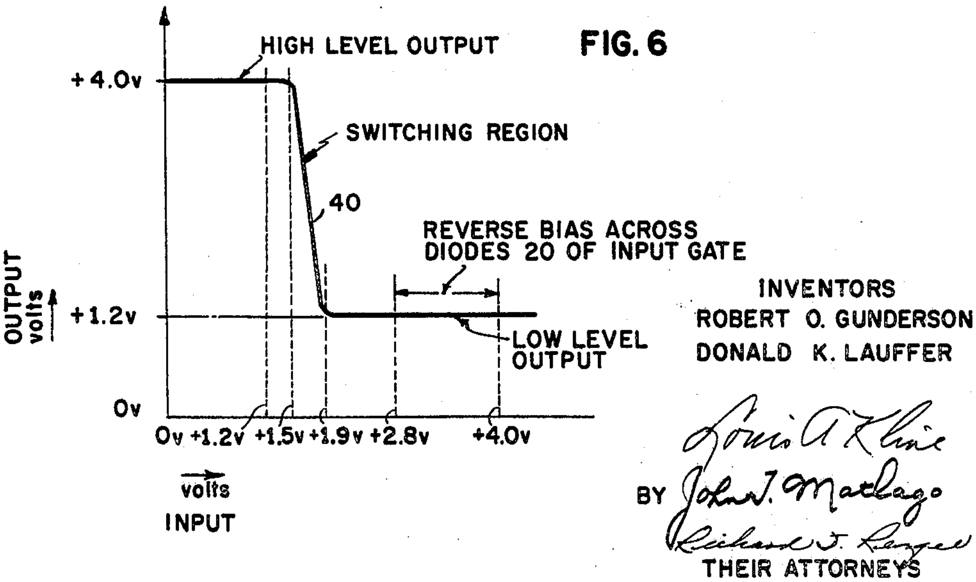
FIG. 6 is a typical direct-current (D.C.) transfer function diagram which illustrates the improved performance of the logical circuit arrangements of FIGS. 1 and 3.

Many of the improved operating characteristics of the logical circuit arrangement of the present invention are apparent from the transfer diagram of FIG. 6. In FIG. 6, the typical direct-current transfer-function diagram discloses the switching characteristics of the logical circuit arrangement of the present invention. In this diagram, the input voltages and output voltages of the circuit of FIG. 1 are indicated on the horizontal and vertical axes, respectively. In response to different D.C. voltages applied to the input terminals 21 of the circuit of FIG. 1, a switching curve 40 is plotted to show the state of the output at node C. As is evident from this curve 40, the circuit arrangement of the present invention provides D.C. stability far above that found in many other logical circuits having precisely regulated (expensive) power supplies. A typical range of input voltages below the high logical level which will assure stability in this circuit state is shown to extend from +4.0 volts to +1.9 volts (range of 2.1 volts). This extremely wide range for input voltages applied to terminals 21 provides many advantages in design and production of any logical system and far exceeds requirements. In the range of input voltages to terminals 21 (from +4.0 volts to +2.8 volts), the present logical circuit is shown, by the curve 40 in FIG. 5(*a*), to be completely immune to noise due to the back-bias on the input gating diodes 20 (FIG. 1). In this range of voltages (4.0 v. to 2.8 v.) and below this range, additional protection against D.C. noise is provided by the input reference voltage circuit described in connection with FIG. 1 and also by the additional voltage swing (2.8 v. to 1.9 v.) required to "turn-off" transistor 18 (FIG. 1). Thus, the logical circuit arrangement of the present invention provides improved D.C. stability (to remain in the proper state) and very high immunity to noise when in this state (producing an inverted low logical level output as shown in FIG. 4(*d*)). When in the opposite state (producing an inverted high logical level output in response to at least one low logical level signal to input terminals 21), the one or more low logical level input voltages to diodes 20 can vary from +1.2 v. to +1.5 v. and still ensure stability (to remain in the latter state). As shown in FIG. 1, diode 32 provides an additional 0.7 v. forward bias noise margin to the reference voltage at node A. Further, both the bias resistor 34 and emitter of switching transistor 16 are connected to ground through transistor 17 and there is no need to provide a separate negative bias voltage source for the bias resistor 34 in order to assure stability in this latter state. Since no separate negative bias voltage source is required, the response time of this circuit is improved over the prior art circuits requiring a negative bias source for stability which, in addition, decreases the response time of these prior art circuits because of the larger voltage swing (and storage time) required to "turn-on" a transistor controlled thereby.

Typical values of passive circuit components for the logical circuit arrangement of FIG. 1 which have been found to produce the desirable operating characteristics described supra, are as follows:

| Resistors: | Ohms |
|---|---|
| 22 | 1500 |
| 30 | 1200 |
| 33 | 400 |
| 35 | 1000 |

As shown by the circuit diagram of FIG. 1, both active and passive circuit components, and interconnections between circuit components, except between the collector of transistor 16 and load resistor 36 (i.e., between terminals 37 and 38), are provided within the integrated circuit "chip" 11 which is shown enlarged in the flat package enclosure 15 in FIG. 2. This integrated circuit includes transistors, diodes, and resistors in the single silicon "chip" (die) 11 for two circuits identical to that shown in FIG. 1, but having a common voltage supply terminal 26 and a common ground terminal 27. Terminal strips for the circuit shown in FIG. 1 and FIG. 2 have the same reference numerals whereas the corresponding terminal strips of the second identical circuit are primed. Thus, in an epitaxial planar diffusion process of forming "chip" 11, two identical circuits of the present invention are formed and the "chip" 11 is mounted in the flat package 15 shown in FIG. 2. The package 15 consists of ceramic material or glass in which the terminal strips are secured. The "chip" 11 is mounted on a flat extension of the ground terminal strip 27 and the remaining terminal strip connections to terminals on the "chip" 11 are made by lead wires, as shown. The components on the "chip" 11 are formed in the planar processing of a p type silicon wafer substrate which may contain several hundred "chips" 11, each "chip" containing identical circuits. The wafer substrate is from 6 to 8 mils thick and has an epitaxial grown n type (conductivity) layer (approximately 1 mil thick). The resulting wafer is thick enough to be handled without excessive breakage during processing and thin enough to provide clean separation after scribing between "chips" 11. The n type epitaxial layer becomes the collector region of the transistors and an anode element of certain ones of the diodes of the two identical circuits thereon. The remaining elements of the transistors, diodes, and resistors are formed in subsequent planar diffusion process steps including isolation of components by a p type (conductivity) diffusion (boron) in areas surrounding individual components, where necessary, and all of the resistors. The second p type (conductivity) diffusion process step provides transistor base regions, resistors and the anode elements of certain ones of the diodes in the isolated areas of n type (conductivity) epitaxial grown layer of silicon. At this point, it should be noted that it is difficult to produce precision resistors having the same value on different wafers in this process of forming integrated circuits. Accordingly, the present logical circuit arrangement takes this factor into account by providing a circuit arrangement which does not depend upon resistors having precise resistor values by referencing the voltages in its input circuit by the voltage referencing circuit described in connection with FIG. 1. The third diffusion process step is of the n+ type (conductivity) (in excess of $2\times10^{20}$ atoms/cm.$^3$ surface concentration of phosphorus to provide contacts for aluminum leads provided in the following metallization pattern processing step). This third diffusion process step forms the transistor emitter areas, cathode regions for certain ones of the diodes and interconnections to elements formed in the first epitaxial n type areas. One or more metallization and etching processing steps follow to provide an interconnection pattern between components in the monolithic circuits. Each of the diffusion process steps in the planar process is preceded by forming a thin film of silicon dioxide (e.g., 5,000 A. thick) which is thermally grown over the epitaxial layer and "photo-resist" processing to expose only the desired areas of the epitaxial layer to diffusion.

With reference to the circuit of FIG. 1 only, in order to provide transistors in these monolithic integrated circuits which have A.C. and D.C. characteristics similar to those of discrete epitaxial transistors (2N2369 and 2N709 types for transistors 16 and 18, respectively, for example), the epitaxial diffused process is modified by selective diffusion of n type impurity (e.g., arsenic) in the silicon substrate before epitaxial growth of the n type layer for the collectors of the transistors 16 and 18. This modification of the integrated circuit process reduces the resistance of the collector region without degrading the collector voltage breakdown characteristics and permits higher n (conductivity) type epitaxial resistivity, thereby reducing junction capacitances. As will be noted later in the discussion of FIG. 7*a* et seq., the circuit of FIG. 3 provides an annular "buried" layer in selected regions only and having an annular configuration to provide the desired characteristics of the npn transistors of FIG. 3 and parasitic pnp transistors instead of diodes shown in FIG. 1.

In the foregoing discussion of monolithic integrated circuits, it was seen that many "chips" 11 were formed in each wafer. It is known that "chips" processed in different wafers often have slightly different operating characteristics and therefore produce different voltage level outputs in an operating logical system and particularly when subjected to different environmental conditions (e.g., temperature) in any logical system arrangement. Accordingly, an important feature of the present invention is to provide voltage referencing at the input to each logical circuit to avoid any dependency upon the operating characteristics of other logical circuits even though the present invention provides for regulation of the output voltage of the logical circuit 10 as described supra. Because of the different operating characteristics and degradation of signals on the lines interconnecting logical circuits in a system, prior art systems that provided only voltage referencing of circuit outputs were unsatisfactory. The reason is that voltage referencing at the outputs of different circuits varied and the degradation of signals made them unsuitable for the many different circuits utilizing these referenced output signals as inputs. The logical circuits of FIGS. 1 and 3 overcome the prior art difficulties by providing voltage referencing at the inputs whereby input signals are referenced to the individual circuit having its own characteristics and using these signals in its own circuit operation. Further, the logical circuit of the present invention avoids the prior difficulties of signal degradation because there are no long circuit paths for the signals to pass before use since the input signals are referenced in each of the individual circuits at the respective input circuits thereof, as set forth in the description of FIG. 1.

Referring now to FIG. 3 for a description of the logical circuit 10*a* of the alternate preferred embodiment of the present invention, it should be noted that when corresponding parts are present in the logical circuit 10 of FIG. 1 and the logical circuit 10*a* of FIG. 3, the reference characters in FIG. 3 include a small *a*. Also, corresponding nodes in FIG. 3 have been primed. The operation of the circuit shown in FIG. 3 is similar to the operation of the circuit shown in FIG. 1 except as discussed in the following description of FIG. 3. Accordingly, many of the features and advantages of the logical circuit 10, FIG. 1, are found in the logical circuit 10*a* and additional features and advantages of the logical circuit 10*a* will become apparent from the description which follows.

In FIG. 3, the gate input circuit includes four pnp transistors 20*a* forming four emitter-follower circuits having their emitters connected to input node A′ and their bases connected to respective input terminals 21*a*. Also, a pnp transistor 19*a* is provided in the output voltage regulator circuit to decrease the response time of the logical circuit to regulate the output voltage. The pnp transistor 19*a* provides for use of a smaller resistance value for resistor 35*a* in view of the fact that only the base current of transistor 19*a* need be passed through transistor 16*a* (and 17*a*) instead of all the current as is passed by diode 19 in the circuit of FIG. 1. With regard to the gating circuit pnp transistors 20*a*, it should be evident that the gain provided by these transistors decreases the current required to be supplied through resistor 30*a*, which, in turn, enables the resistance value to be decreased to provide faster response to changes in logical level of signals applied to input terminals 21*a*. On the other hand, the "fan-in" of the logical circuit 10′ is substantially improved since the amount of current supplied to each of the base inputs is substantially reduced.

An additional pnp transistor 13, which has no corresponding circuit component in the logical circuit of FIG. 1, has been provided in the output circuit of FIG. 3 to prevent transistor 16*a* from going into saturation and also to reduce the "turn-off" time of transistor 16*a*. The base-emitter junction of the (parasitic) pnp transistor 13 has a lower threshold voltage than the base-collector junction of the transistor 16*a* because of the higher doping concentration (n) in the integrated circuit construction of the base-collector junction of npn transistor 16*a* than the doping concentration (n) of the base-emitter junction of transistor 13. As a result, the (parasitic) pnp transistor 13 will "turn-on" to shunt excess base current through transistor 13 to ground (substrate) when npn transistor 16*a* tends to go into saturation. The higher doping concentration (n) of the base-emitter junction of transistor 16*a* is due to annular "buried" layer 70 which, as shown in FIG. 7*b*, projects into the epitaxial n region for the npn transistor 16*a*. The center of the annular "buried" layer 70 does not have the high concentration of n+ doping (e.g., arsenic) which is present in the annular layer to provide for the (parasitic) pnp transistor 13, as shown in FIG. 7*b*. The advantage of this circuit arrangement, which prevents output transistor 16*a* from going into a state of saturation, is to prevent storage of an excess charge, which causes a (storage) delay in "turn-off" of transistor 16*a* when the logical level applied to logical circuit 10*a* changes from high level to low level.

Considering the operation of the logical circuit 10*a*, FIG. 3, initially it will be assumed that at least one input signal applied to terminals 21*a* is at the low logical level (+1.2 v.) prior to going to the high logical level, as shown by the waveforms in FIG. 4(*a*). In response to the low level signal (1.2 v.), the bases of the pnp transistors 20*a* connected thereto are "turned-on" and emitter current therefor is supplied through resistor 30 from supply terminal 26*a*. This lowers the voltage (to +1.9 v.) at the base input of transistor 18*a* (node A′), as shown by the waveform in FIG. 4(*b*), whereby transistor 18*a* is conducting only a very small current (1 ma.) and is barely in the active state. Transistor 16*a* is in the inactive "off" state (when transistor 18*a* is barely conducting) in response to the low voltage (0.4 v. or less) applied to the base input, as shown by the waveform in FIG. 4(*c*). It should be noted that since the additional gain of transistor 18*a* is not needed because of the gain of pnp transistors 20*a* in the gate, a diode coupling would retain the desired noise immunity at the base input to transistor 16*a*. However, the transistor 18*a* further increases the gain of the logical circuit 10*a* over the gain provided by pnp transistors 20*a* in the gate circuit. The transistors 13 and 19*a* are also in the inactive "off" state when one of the gating circuit inputs is at the low logical level to produce the high logical level output (+4.0 v.), as shown by the waveform in FIG. 4(*c*). The base of transistor 17*a* is always above ground as provided by the voltage divider (resistors 31*a*, 33*a*, and 35*a*) to maintain a forward bias across its base-emitter junction to keep it in "saturation" when the output at node C′ is at the high logical level. The foregoing describes the status of the circuit prior to all of the signals at input terminals 21*a* going to the high logical level (+4.0 v.) at which time the voltage at all of the bases of pnp transistors 20*a* are raised to the high logical level (+4.0 v.).

In response to the high voltage level (+4.0 v.) logical AND condition at the inputs, transistors 20*a* are "turned-off" and the current supplied through resistor 30*a* is applied to the base of transistor 18*a* to raise the voltage at node A′ (FIG. 4(*b*)) to place transistor 18*a* well into its active state which, in turn, supplies current Ir to resistor 34*a* to raise the voltage at node B′ (FIG. 4(*c*)) and the base of transistor 16*a* to place transistor 16*a* in the active state. As a result, the output voltage at the output node C′ will fall to the low logical level (FIG. 4(*d*)) to "turn-on" transistor 19*a* to direct the current through resistor 35*a* from resistors 31*a* and 33*a* through transistor 19*a*. In response to the lowering of current in the resistors 31*a* and 33*a*, the voltage at the base of transistor 17*a* will fall, tending to bring transistor 17*a* out of "saturation" to increase the impedance thereof, and the emitter circuit of transistor 16*a* to limit the base current of transistor 16*a* to precent excessive "overshoot" of the voltage at output node C′ below the low logical level (+1.2 v.).

Typical values of passive circuit components for the logical circuit arrangement of FIG. 3 which have been found to produce the desirable operating characteristics described, supra, are as follows:

| Resistors: | Ohms |
|---|---|
| **22***a* | 1500 |
| **30***a* | 1200 |
| **31***a* | 300 |
| **33***a* | 390 |
| **34***a* | 160 |
| **35***a* | 160 |
| **36***a* | 200 |

Referring now to FIG. 7*a* in conjunction with FIGS. 7*b*, 7*c* and 7*d*, logical circuit 10*a* of FIG. 3 is shown in FIG. 7*a* to be arranged to conform to the layout of the components and connections in one-half of the integrated circuit "chip" 11, for example, as shown in FIG. 2, to illustrate certain novel features of the logical circuit arrangement of the present invention and particularly those novel features disclosed in the construction of the output circuit, including transistors 16*a*, 13, and 19*a*. These novel features are directed to the manner in which the output circuit transistors are formed in the "chip" 11, which includes an annular "buried" layer 70 (FIG. 7*d*) and epitaxial layer 80, to provide the advantages of minimizing excess bias current in transistor 16*a* and, also, to provide a logical circuit 10*a* having improved response to changes in the logical level applied to its logical inputs. As shown in FIG. 7*a*, transistors 16*a*, 13, and 19*a* are formed in a single isolation region 77 only, in the half of "chip" 11. Further, the (parasitic) pnp transistor 13 is formed coaxially with the annular "buried" layer in isolation region 77. The "chip" 11 has not been processed by gold doping which has been found in the past to cause, in some instances, an erratic and unpredicatable storage time delay because of difficulties in preventing either high gold content (low storage time) or, little or no gold content in the silicon crystal of the "chip" 11. FIG. 7*a*, 7*b*, 7*c* and 7*d* illustrate the integrated circuit construction and circuit for transistors 16*a*, 13, and 19*a* in a single isolation region 77. In FIG. 7*b*, the isolation region 77 of the integrated circuit "chip" 11 is shown in cross section to clearly illustrate the construction thereof. FIG. 7*c* is a separate circuit diagram of the circuit formed in the isolation region 77, shown in cross section in FIG. 7*b*. The transistors 16*a*, 13, and 19*a* have been clearly designated in FIG. 7*b* to provide easy reference to the proper diffusion layers for the npn transistor 16*a*, parasitic pnp transistor 13, and for the pnp transistor 19*a*.

Referring again to FIG. 7*b*, the isolation region 77 is formed on the p type (boron) silicon substrate forming collectors of the pnp transistors (in the range of 6 to 8 mils thick with a resistivity of approximately 10 ohm cm.). The epitaxial layer 80 (collector of npn transistor 16*a*) is n type silicon (phosphorus) approximately 1 mil (1/1000 inch) thick with a resistivity of 0.5 ohm cm. The annular "buried" layer 70 is a heavily doped region (in excess of $10^{19}$ atoms/cm.) of n+ type silicon (arsenic). The "isolation' 'diffusion step produces the isolation region 77 by forming an isolation barrier 78 of p+ type (boron) material surrounding the isolation region 77. The individual regions 81 and 82 are formed of p+ type (boron) material in the next diffusion step. In region 81, the next diffusion step produces the n+ emitter region 83 of n+ type material (phosphorus). In this same diffusion step, n+ type contact regions 84 are formed in the epitaxial layer 80. Contact regions 84 make contact to the subsequently formed section 85 of the metallization pattern to connect the epitaxial collector region for npn transistor 16*a* and p type emitter region for pnp transistors 13 and 19*a*. The interconnecting leads shown in FIGS. 7*a* and 7*c* are formed in the metallization step of the integrated circuit forming process.

The resulting integrated circuit arrangement shown in FIG. 7*c* provides two important features in reducing the propagation delay of changes in logical levels in a logical system, namely, the reduction of excess base current in transistor 16*a* by shunting the excess base current to ground through transistor 13, and reducing the collector current supplied to transistor 16*a* by passing all but the base current of transistor 19*a* to ground. Further, the output circuit arrangement, including npn and pnp transistors 16*a*, 13, and 19*a*, are all contained in a single isolation area 77 on the "chip" 11. This latter advantage is found, in part, in utilizing an annular "buried" layer to provide the parasitic pnp transistor 13. In view of the foregoing, it should be clear that not only does the logical circuit arrangement provide advantages inherent in the circuit arrangement for integrated circuits, but also these additional advantages are provided by this novel integrated circuit construction.

Referring now to FIG. 8, a typical system circuit arrangement in a logical system is shown to include several groups of logical circuits of FIG. 3, which system arrangement illustrates some of the novel features and advantages of the present invention, i.e., its capabilities in providing improved logical system circuit arrangements for improving the operation of logical systems as illustrated by typical groups of circuits 88 and 89 (e.g., logical circuit 10*a* shown in FIG. 3) in these logical systems. One of these system circuit arrangements comprises the first group of NAND circuits 88 (AND gate function with inverted output) shown in FIG. 8, including logical circuits (logical building blocks) 10*a*, 10*b* . . . and 10*n*, having logical inputs as shown, which are connected together at their collector outputs by terminals 38*a*, 38*b* . . . and 38*n*, which forms an AND gate. This AND gate is simply and easily formed by connecting their respective collectors (each collector corresponding to collector of transistor 16*a* in FIG. 3) to a common line 87 which is then connected to a single one of the input terminals 21*a′* (transistor gate input) of the logical circuit 10*a′* (FIG. 8). It should be noted that only the first one of this group of circuits 88, circuit 10*a*, provides a connection to its load resistor 36*a* (FIG. 3) which acts as a common load resistor for all of the logical circuits 10*a*, 10*b* . . . and 10*n*. In this manner, as many as twenty-five or more logical circuits can be connected together to form an AND gate for their outputs as indicated by the logical equation (product) therefor in FIG. 8 as follows:

$$(M_1M_2M_3M_4)'(F_1N_3S_1'S_5')' \ldots (K_1K_2K_3'N_5)'$$

The logical circuit 10*a* functions as a NAND gate (AND gate function with inverted output) as illustrated by the manner in which the group of NAND gates 88 and another logical circuit 10*y*, also functioning as a NAND gate, are coupled to respective inputs 21*a′* of the logical circuit 10*a′*. The separate (two) stages of circuits demonstrate the manner in which the logical circuit arrangements of the present invention provide a logical system in which "positive" logic is employed to provide a logical system in which the outputs of a single stage are inverted outputs, but the outputs of second stages always provide logical signals for performance of logical operations in a logical system using "positive" logic. Thus, while inverted signals from outputs of the first stage may not be suitable for certain logical operations, e.g., storage in flip-flops and other logical storage circuits, the second inversion in the second stage restores the initial logical voltage levels of the logical signals (non-inverted) for performance of logical operations in accordance with "positive" logic.

Another group of logical circuits 89, as shown in FIG. 8, illustrates the manner in which the logical circuits of the present invention (e.g., logical circuit of FIG. 3) provide for a large "fan-out" in logical systems. As many as twenty-five or more logical circuits 10*a′*, 10*b′*, 10*c′* . . .

and $10n'$ are coupled to the output of a single logical circuit 10$y$, which is capable of accepting base current from all of these circuits, as shown, and additional transient current (due to stray capacity of circuit interconnections) during the voltage "fall-time" due to the change in voltage from +4.0 volts to +1.2 volts, for example. Thus, the present circuit is capable of accepting its own resistor load current, current from inputs of other circuits as shown in FIG. 8, and additional transient current during voltage "fall-time" (+1.2 v. to +0.4 v.). The additional transient current results from an assumed capacitance seen at the output, i.e., stray line capacitance and input capacitance of the twenty-five or more circuits coupled to the output in a "fan-out" of twenty-five or more, as shown in FIG. 8. The typical logical circuit having the values set forth supra, provides for a steady state (D.C.) output current with a +1.2 volt maximum lower logical level output voltage. Assuming a +1.2 volt minimum lower output voltage for logical systems and corresponding output current, a current is accepted from the load resistor 36*a* (FIG. 3), and more than adequate output current is available to the transistor outputs of other circuits connected to its output terminal 38*a*. A typical transistor input of the present logical circuit requires only base current; accordingly, a "fan-out" of twenty-five or more would require only a relatively small output ("sinking") current, which is well within the available output current of this logical circuit 107 of FIG. 3. At this point it should be noted that the present circuit arrangement 10 or 10*a* of FIGS. 1 and 3 are not limited in application to driving other logical circuits, and are capable of driving other external loads, including relays, indicators, etc. Such other loads include loads having higher voltages, e.g., 10 volts, in which case a load resistor of higher resistance than load resistor 36 or 36*a* is preferable to reduce the drive current required therefor. Accordingly, when driving other loads by the present logical circuit 10*a* (FIG. 3) or logical circuit 10 (FIG. 1), the respective output terminals 37, 38, or 37*a*, 38*a* are not connected and a load resistor of larger value is supplied along with the +10 volt load circuit(s).

In FIG. 9*a*, another improved system circuit arrangement is shown (block diagram) which utilizes the novel features of the logical circuits 10 or 10*a* of the present invention. This system circuit arrangement is illustrated by logical gating circuits 10*p* and 10*p'* having details shown diagrammatically in FIG. 1 or 3 with one important difference, namely: the output terminals 37*p* and 38*p* of circuit 10*p* (e.g., corresponding to terminals 37 and 38 shown in FIG. 1) are not interconnected. Instead, the terminal 38*p* of the first stage circuit 10*p* (which is connected to the collector of the corresponding transistor 16, as shown in FIG. 1, for example), is connected to terminal 37*p'* (and corresponding load resistor 36, for example, as shown in FIG. 1) of the second stage circuit 10*p'*. This feature is considered to be important to most logical system arrangements which have long lines or cables interconnecting logical circuits, e.g., as illustrated in FIG. 9*a* wherein a long line 90*a* is shown interconnecting the output of the first stage circuit 10*p* to the input of the second circuit 10*p'*. In most instances, lines interconnecting logical circuits in a system construction are formed into cables (groups of lines) to route the lines to different sections of the system. Whenever these lines are long, they appear as transmission lines having series inductances and parallel capacitances, as indicated by the equivalent circuit for a typical transmission line 90*b* in FIG. 9*b*. Accordingly, it is desirable to properly terminate these long lines by a low impedance, e.g., at the input to logical circuit 10*p'*. For the above reasons, the long line 90*a* (FIG. 9*a*) has the characteristic impedance of a typical transmission line 90*b* (FIG. 9*b*), including inductive and capacitive reactances illustrated by the equivalent circuit therefor in FIG. 9*b*. Since the inputs to the logical circuits (e.g., circuit 10*p'*) require a diode gate or transistor gate of high impedance for operation, the signals on the long line 90*a* would be reflected in the absence of the system circuit arrangement described above and shown in FIG. 9*a*. This circuit arrangement, however, provides for physical placement of the load resistor (e.g., load resistor 36 in FIG. 1) at the input to circuit 10*p'* to lower this input impedance to provide proper termination of the long line 90*a* whereby reflection of signals is substantially eliminated. Thus, the present circuit arrangement shown in FIG. 9*a* provides better signal coupling to circuit inputs of FIG. 1 or 3 because it avoids reflection of signals which otherwise would occur in a logical system.

In the light of the above teachings, various modifications and variations of the present invention are contemplated and will be apparent to those skilled in the art without departing from the spirit and scope of the invention.

What is claimed is:

1. A basic building block for high-speed logical systems comprising monolithic circuit means formed in a single block of silicon, said circuit means comprising:

first stage circuit means having an output and at least one input for receiving signals of first and second logical voltage levels, said first stage circuit means being constructed and arranged to provide a low impedance source of bias current at said output in response to signals of said first logical voltage level;

second stage circuit means coupled to said output for producing signals of said second logical voltage level in response to said bias current, said second stage circuit means including a first npn transistor having a collector, base, emitter and collector-base junction wherein said base is coupled to said output to provide an emitter current path for said bias current to produce active operation of said first transistor and said second logical voltage level at said collector, said second stage circuit means further includes a parasitic pnp transistor having a base-emitter junction having a lower threshold voltage than the threshold voltage of the collector-base junction of said npn transistor, said pnp transistor being connected across the collector-base junction of said npn transistor to by-pass excess base current applied to the base of said npn transistor to prevent operation of said npn transistor in a state of saturation; and control circuit means coupled to said second stage circuit means for regulating the voltage level at said collector to said second logical voltage level during operation of said first npn transistor, said control circuit means including semiconductor means in the emitter current path of said first npn transistor, said semiconductor means also being coupled to said collector to be responsive to the voltage at said collector for varying the conduction of said semiconductor means and thereby vary the impedance thereof and the impedance of said emitter current path to control the operation of said first npn transistor in its active region to regulate the voltage at said collector to said second logical voltage level.

2. The basic building block according to claim 1 in which said block of silicon includes a buried layer of n+ type material formed in a substrate of p type material wherein said npn transistor is formed above said buried layer, and said parasitic pnp transistor is formed adjacent said buried layer and said substrate forms the collector element of said pnp transistor.

3. A basic building block for high-speed logical systems comprising circuit means formed in a block of silicon including a substrate of p type material, a layer of n type material formed over said substrate, a buried layer of n+ type material formed in predetermined adjacent areas only of said substrate and n type material, a layer of p+ type material formed in said n type material, and a layer of n+ type material formed in said p+ type material wherein a parasitic pnp transistor having collector-base and base-emitter junctions is formed laterally adjacent said buried layer including said p substrate, n type layer, and p+ type layer; said circuit means comprising:

first stage circuit means having an output and at least one input for receiving signals of first and second logical voltage levels, said first stage circuit means being constructed and arranged to provide a low impedance source of bias current at said output in response to signals of said first logical voltage level;

second stage circuit means coupled to said output for producing signals of said second logical voltage level in response to said bias current, said second stage circuit means including a first transistor comprising an npn transistor having a collector, base, emitter, collector-base and base-emitter junctions formed above said buried layer including said n, p+, and n+ type layers of material wherein the collector-base junction has a higher threshold voltage than the base-emitter junction of said pnp transistor and wherein said base is coupled to said output to provide an emitter current path for said bias current to produce active operation of said first transistor and said second logical voltage level at said collector, said second stage circuit means includes said pnp transistor having its base-emitter junction connected across the collector-base junction of said first transistor to bypass excess bias current; and control circuit means coupled to said second stage circuit means for regulating the voltage level at said collector to said second logical voltage level during operation of said first transistor, said control circuit means including an npn control transistor in the emitter current path of said first transistor, said control transistor having a collector coupled to the emitter of said first transistor and a base coupled to the collector of said first transistor to be responsive to the voltage at said collector for varying the conduction of said control transistor to increase its impedance in response to a decrease in voltage on the collector of the first transistor and the impedance of said emitter current path to control the operation of said first transistor in its active region to regulate the voltage at the collector of said first transistor to said second logical voltage level.

4. A basic building block for high-speed logical systems comprising:

first stage circuit means having an output and at least one input for receiving signals of first and second logical voltage levels, said first stage circuit means being constructed and arranged to provide a low impedance source of bias current at said output in response to signals of said first logical voltage level;

second stage circuit means coupled to said output for producing signals of said second logical voltage level in response to said bias current, said second stage circuit means including a first transistor having a collector, base and emitter wherein said base is coupled to said output to provide an emitter current path for said bias current to produce active operation of said first transistor and said second logical voltage level at said collector;

control circuit means coupled to said second stage circuit means for regulating the voltage level at said collector to said second logical level during operation of said first transistor, said control circuit means including semiconductor means in the emitter current path of said first transistor, said semiconductor means also being coupled to said collector to be responsive to the voltage at said collector for varying the conduction of said semiconductor means and thereby vary the impedance thereof and the impedance of said emitter current path to control the operation of said first transistor in its active region to regulate the voltage at said collector to said second logical voltage level; and all of said circuit means being formed on a block of silicon material including a p type substrate, a buried layer of n+ type material and n type, p+ type and n+ type layers of said material, and separate isolation areas in which a single isolation area includes said first transistor comprising an npn transistor formed by said n type, p+ type and n+ type layers of material above said buried layer and first and second pnp transistors each having a collector, base and emitter formed by said p type substrate, n type layer and p+ type layer wherein the bases of said first and second pup transistors are coupled to the collector of said first transistor, the emitter of said first pnp transistor is coupled to the base of said first transistor to bypass excess bias current coupled to said first transistor, and the emitter of the second pnp transistor is coupled to said semiconductor means to couple the voltage on said first collector to said semiconductor means to vary the operative state and impedance thereof to regulate the voltage at the collector of said first transistor.

5. In an integrated circuit construction formed on a single piece of semiconductor material, a circuit arrangement for providing high-speed logical switching operations between first and second logical voltage levels comprising:

switching circuit means including a first transistor having a collector, base and emitter, said first transistor being responsive to a first base current to place said first transistor in its active operative state to lower the impedance of said transistor to conduct current from said collector to emitter to produce said second logical voltage at said collector;

an output circuit coupled to said collector; and regulating circuit means coupled to said first transistor for reducing the time interval required to place said first transistor in said operative state and producing a constant second logical voltage level at said collector during operation of said first transistor by regulating said first base current, said regulating circuit means including a second transistor having a collector, base and emitter, and coupled to said first transistor to provide a low impedance base current path when said first transistor is not in said active operative state and a variable impedance base current path for said first transistor to regulate said base current and collector voltage when said first transistor is in said active operative state, said regulating circuit means further including feedback circuit means including a semiconductor junction providing a forward voltage drop and a unidirectional current path from said feedback circuit means to the collector of said first transistor and said output circuit when said first transistor is in said active operative state, said feedback circuit means including a source of bias current coupled to the base of said second transistor and constructed and arranged to supply and control a second base current to said second transistor to vary the impedance thereof including decreasing said second base current only after the first transistor passes through transition to the active operative state and the resulting decrease in output voltage at the collector of the first transistor exceeds said forward voltage drop to conduct bias current from said feedback circuit to said output circuit.

6. The integrated circuit construction according to claim 5 in which said first and second transistors are both npn transistors and said circuit arrangement comprises a NAND gate including a plurality of pnp transistors, each having a collector, base and emitter wherein separate logical signals of first and second logical voltage levels are applied to respective bases, and the emitters of said pnp transistors are coupled to the base of said first transistor, said pnp transistors being responsive to logical signals of said first logical voltage levels applied to the respective bases thereof to cause said first base current to be supplied to said first transistor to produce said second logical voltage level at the collector of said first transistor.

7. The integrated circuit construction according to claim 5 in which said feedback circuit means further includes voltage divider circuit means comprising a first resistor coupling the collector of said first transistor to the base of said second transistor.

8. In an integrated circuit construction formed on a single piece of semiconductor material, a circuit arrangement for providing high-speed logical switching operations between first and second logical voltage levels comprising:

switching circuit means including a first transistor having a collector, base and emitter, said first transistor being responsive to a first base current to place said first transistor in its active operative state to lower the impedance of said transistor to conduct current from said collector to emitter to produce said second logical voltage at said collector; and regulating circuit means coupled to said first transistor for reducing the time interval required to place said first transistor in said operative state and producing a constant second logical voltage level at said collector during operation of said first transistor by regulating said first base current, said regulating circuit means including a second transistor having a collector, base and emitter, and coupled to said first transistor to provide a low impedance base current path when said first transistor is not in said operative state and a variable impedance base current path for said first transistor to regulate said base current and collector voltage when said first transistor is in said operative state, said regulating circuit means further including feedback circuit means coupling the collector of said first transistor to the base of said second transistor, said feedback circuit means being constructed and arranged to supply a second base current to said second transistor to vary the impedance thereof, said feedback circuit means further including voltage divider circuit means comprising a first resistor and a back-biased semiconductor coupling the collector of said first transistor to the base of said second transistor to provide capacitive A.C. coupling across said resistor.

9. The integrated circuit construction according to claim 8 in which said switching circuit means further includes a supply source supplying said first logical voltage level and circuit means including a second resistor coupling said supply source to said collector of said first transistor.

10. The integrated circuit construction of claim 5 in which said switching circuit means further includes a pn junction semiconductor connected between the base and collector of said first transistor to conduct excess of said first base current supplied to the base of said first transistor to maintain operation of said first transistor in said operative state in response to said first base current.

References Cited

UNITED STATES PATENTS

| | | | |
|---|---|---|---|
| 3,105,159 | 9/1963 | Ditkosky | 307—300 |
| 3,183,370 | 5/1965 | Tampel | 307—300 |
| 3,206,620 | 9/1965 | Freeman et al. | 307—229 |
| 3,217,181 | 10/1965 | Zuk | 307—300 |
| 3,327,182 | 6/1967 | Kisinko | 317—235 |

DONALD D. FORRER, Primary Examiner

B. P. DAVIS, Assistant Examiner

U.S. Cl. X.R.

307—213, 214, 237, 300; 317—235